(12) United States Patent
Oaki et al.

(10) Patent No.: US 7,627,165 B2
(45) Date of Patent: Dec. 1, 2009

(54) PATTERN INSPECTION METHOD AND APPARATUS USING LINEAR PREDICTIVE MODEL-BASED IMAGE CORRECTION TECHNIQUE

(75) Inventors: Junji Oaki, Kanagawa (JP); Shinji Sugihara, Tokyo (JP); Yuichi Nakatani, Kanagawa (JP)

(73) Assignee: Advanced Mask Inspection Technology Inc., Yokohama-shi (JP)

( * ) Notice: Subject to any disclaimer, the term of this patent is extended or adjusted under 35 U.S.C. 154(b) by 676 days.

(21) Appl. No.: 11/360,813

(22) Filed: Feb. 24, 2006

(65) Prior Publication Data

US 2007/0064996 A1    Mar. 22, 2007

(30) Foreign Application Priority Data

Sep. 22, 2005   (JP)   ............................. 2005-276583

(51) Int. Cl.
   *G06K 9/00*   (2006.01)
(52) U.S. Cl. ...................................... 382/144; 382/149
(58) Field of Classification Search ......... 382/141–149, 382/151, 190, 209, 218, 309; 348/86, 92, 348/125
   See application file for complete search history.

(56) References Cited

U.S. PATENT DOCUMENTS 7,366,343 B2 * 4/2008 Takeuchi .................... 382/145
7,444,616 B2 * 10/2008 Sandstrom et al. ............ 716/21

2006/0018530 A1   1/2006 Oaki et al.

FOREIGN PATENT DOCUMENTS

| JP | 8-76359 | 3/1996 |
|---|---|---|
| JP | 10-96613 | 4/1998 |
| JP | 11-153550 | 6/1999 |
| JP | 2000-105832 | 4/2000 |
| JP | 2000-241136 | 9/2000 |
| JP | 2006-30518 | 2/2006 |

OTHER PUBLICATIONS

U.S. Appl. No. 11/360,813, filed Feb. 24, 2006, Oaki et al.
U.S. Appl. No. 11/567,550, filed Dec. 6, 2006, Oaki.
U.S. Appl. No. 11/567,520, filed Dec. 6, 2006, Oaki.
U.S. Appl. No. 11/386,744, filed Mar. 23, 2006, Sugihara et al.
Japanese Office Action for application No. 2006-227348, Aug. 25, 2009.

* cited by examiner

*Primary Examiner*—Daniel G Mariam
(74) *Attorney, Agent, or Firm*—Oblon, Spivak, McClelland, Maier & Neustadt, L.L.P.

(57) ABSTRACT

An image correction device for use in pattern inspection apparatus is disclosed. This device includes a pattern extraction unit for extracting a pattern, as a cut-and-paste pattern, from a pattern existence region of an inspection reference pattern image and a pattern image of a workpiece being tested. The device also includes a pattern pasting unit for pasting the cut-and-paste pattern in blank regions of the reference and under-test pattern images to thereby create a pasted reference pattern image and a pasted test pattern image. The device further includes an equation generator for generating by linear predictive modeling a set of simultaneous equations relative to the pasted reference and test pattern images, a parameter generator for solving these equations to obtain a model parameter(s), and a unit for creating a corrected pattern image by the linear predictive modeling using the model parameter(s).

11 Claims, 13 Drawing Sheets

PATTERN INSPECTION METHOD AND APPARATUS USING LINEAR PREDICTIVE MODEL-BASED IMAGE CORRECTION TECHNIQUE

CROSS-REFERENCE TO RELATED APPLICATION

This application claims priority of Japanese Patent Application No.2005-276583, filed on Sep. 22, 2005, the entire contents of which are incorporated herein by reference.

BACKGROUND OF THE INVENTION

1. Field of the Invention

The present invention relates generally to image correction technologies and, more particularly, to a method and apparatus for inspecting pattern images for defects, including ultrafine circuit patterns of reticles for use in the manufacture of large-scale integrated (LSI) semiconductor devices and/or low-profile flat panel display devices, such as liquid crystal display (LCD) panels.

2. Description of the Related Art

Usually, LSI chip fabrication comes with cost penalties, so it is inevitable to improve production yields. One of yield reduction factors must be the presence of pattern defects of a reticle used for photolithographically transferring or "imaging" an ultrafine circuit pattern onto semiconductor wafers. In recent years, as LSI chips decrease in feature sizes, pattern defects to be detected decrease in minimum size. This in turn requires a further increase in accuracy of a pattern inspection apparatus for inspecting a reticle for defects.

Currently established pattern defect inspection methodology is generically classified into two approaches, one of which employs die-to-die (DD) comparison techniques, and the other of which uses due-to-database (DB) comparison schemes. The DD comparison is a method for detecting defects through comparison between those images of two square regions or "dies" on a reticle while regarding one of them as an inspection reference pattern image and letting the other be a pattern image under testing. The DB comparison is a method of detecting defects by comparing the sensor data of a die to design data as created from computer-aided design (CAD) data for the LSI design use.

With the quest for further miniaturization of on-reticle circuit patterns, a need is felt to attain the ability to detect extra-fine defects, which are small enough to be buried in a positional offset between picture elements or "pixels" of to-be-compared images, image expansion/shrink, swell, and sensing noises. In the DD or DB comparison also, it becomes very important to accurately perform alignment and image correction in units of sub-pixels, which are typically done prior to the pattern inspection by comparison of the reference pattern image and under-test pattern image.

A known approach to meeting this need is to employ a pre-finishing process prior to execution of the "main" inspection by comparison of a couple of images—i.e., the inspection reference pattern image and the test pattern image. This process includes the steps of performing bicubic interpolation-based alignment in units of subpixels and thereafter sequentially performing image expansion/shrink correction, image swell correction, resize correction, noise averaging processing and others. An example of the image expand/shrink correction is disclosed in JP-A-2000-241136. Unfortunately, mere repeated execution of these corrections would result in occurrence of accumulated errors, which can cause appreciable image degradation or "corruption." Another problem faced with the prior art lies in difficulties in setting appropriate values for a great number of parameters required for respective corrections and also in setup of an adequate execution order of such correction processes.

BRIEF SUMMARY OF THE INVENTION

It is therefore an object of this invention to provide a technique for accurately correcting or "amending" the image of a workpiece under inspection.

Alternative object of the invention is to provide an approach to accurately inspecting the image of a workpiece being tested.

A currently preferred form of the invention is the one that integrally combines together alignment and image correction techniques. Its one principal feature lies in effective image correction using input/output predictive modeling which is less in image degradation or "corruption" and also less in number of setup parameters. This image correction is typically for realizing the alignment and the image correction in units of subordinate pixels or "sub-pixels" by using a two-dimensional (2D) input/output predictive modeling scheme while letting an inspection reference pattern image be used as input data and also letting an under-test pattern image be output data, by way of example. In this case, the image data is used to create a relational expression of a matrix; then, solve a set of simultaneous equations to thereby identify more than one model parameter. Next, based on the identified 2D linear predictive model, a correction image is created.

In this event, those pattern images containing therein pattern elements at very low densities—say, extra-low density pattern images—can sometimes fail to achieve any intended level of model parameter accuracy due to deficiency of the information within the matrix even when attempting to perform the 2D linear predictive model identification. In this case, a need is felt to provide a method of modifying the matrix in such a way as to increase the accuracy of model-parameter identification. Illustrative embodiments of the invention are made in view of the technical background above, for enabling achievement of effective image correction by employing a unique processing mechanism for virtually making dense the image of a pattern which is very low in graphics density during image correction in a pattern inspection apparatus, such as a reticle inspection apparatus.

In accordance with a first aspect of this invention, an image correction device for using an inspection reference pattern image of a workpiece being tested and a pattern image under test to generate a corrected pattern image is provided. This device includes a pattern extraction unit operative to cut a pattern, as a cut-and-paste pattern, out of a pattern existence region of each of the reference pattern image and the under-test pattern image. The device also includes a pattern pasting unit operative to paste and patch the cut-and-paste pattern in pattern-less blank regions of the reference pattern image and the under-test pattern image to thereby generate a pasted reference pattern image and a pasted test pattern image, an equation generation unit operative to generate by linear predictive modeling a set of simultaneous equations for the patched reference pattern image and the patched test pattern image, and a parameter generation unit operative to solve the simultaneous equations and obtain more than one model parameter. The device further includes a corrected pattern image creation unit operative to use the model parameter to apply the linear predictive modeling to the pattern image for creation of a corrected pattern image.

In accordance with a second aspect of the invention, a pattern inspection apparatus is provided, which uses a reference pattern image of a workpiece being tested and a pattern image under test to generate a correction pattern image and then performs pattern inspection. This apparatus includes a pattern extraction unit operative to cut a pattern as a cut-and-paste pattern out of a pattern existence region of the reference pattern image and the under-test pattern image, a pattern pasting unit operative to paste and patch the cut-and-paste pattern in pattern-less blank regions of the reference pattern image and the under-test pattern image to thereby generate a pasted reference pattern image and a pasted test pattern image, and an equation generation unit operative to generate by linear predictive modeling a set of simultaneous equations for the patched reference pattern image and the patched test pattern image. The inspection apparatus also includes a parameter generation unit operative to solve the simultaneous equations and obtain more than one model parameter, and a corrected pattern image creation unit operative to use the model parameter to apply the linear predictive modeling to the pattern image for creation of a corrected pattern image. The apparatus further includes a pattern image comparison unit operative to compare the corrected pattern image and the under-test pattern image.

In accordance with a third aspect of the invention, an image correction method for using an inspection reference pattern image of a workpiece being tested and a pattern image under test to generate a corrected pattern image is provided. This method includes the steps of cutting a pattern as a cut-and-paste pattern out of a pattern existence region of the reference pattern image and the under-test pattern image, pasting the cut-and-paste pattern in pattern-less blank regions of the reference pattern image and the under-test pattern image to thereby generate a pasted reference pattern image and a pasted test pattern image, generating by linear predictive modeling a set of simultaneous equations for the patched reference pattern image and the patched test pattern image, solving the simultaneous equations and obtain more than one model parameter, and using the model parameter to apply the linear predictive modeling to the pattern image for creation of a corrected pattern image.

In accordance with a fourth aspect of the invention, a pattern inspection method for using a reference pattern image of a workpiece being tested and a pattern image under test to generate a correction pattern image and for performing pattern inspection is provided. The inspection method includes the steps of cutting a pattern as a cut-and-paste pattern out of a pattern existence region of the reference pattern image and the under-test pattern image, pasting the cut-and-paste pattern in pattern-less blank regions of the reference pattern image and the under-test pattern image to thereby generate a pasted reference pattern image and a pasted test pattern image, generating by linear predictive modeling a set of simultaneous equations for the patched reference pattern image and the patched test pattern image, solving the simultaneous equations and obtain more than one model parameter, using the model parameter to apply the linear predictive modeling to the pattern image for creation of a corrected pattern image, and comparing the corrected pattern image and the under-test pattern image.

DETAILED DESCRIPTION OF THE INVENTION

An image correction technique and a pattern inspection procedure in accordance with currently preferred embodiments of this invention will now be explained with reference to the accompanying drawings below.

(Image Correction Device)

An image correction device embodying the invention is for correction or "amendment" of a pattern image as drawn on a workpiece being tested. The image corrector device uses an inspection reference pattern image of a workpiece under test and a sensed pattern image of the under-test workpiece to generate a correction pattern image. This pattern image is a corrected or "amended" version of the inspection reference pattern image or the test pattern image. Although the description below assumes that the test workpiece is a reticle for example, the workpiece may alternatively be any other pattern image-formed objects for use in the manufacture of semiconductor devices or LCD panels, including but not limited to photomasks and wafers. The reference pattern image and the test pattern image are the ones that are compared together. In case there are two pattern images to be compared, no differences occur if the reference pattern image and the test pattern image are named vice versa. The reference pattern image and test pattern image are for use as objects to be compared by the DD or DB comparison scheme.

(Pattern Inspection Apparatus)

A pattern inspection apparatus embodying the invention is the one that inspects for defects a pattern image as drawn on a workpiece being tested. This inspection apparatus includes the image correction device, for comparing a pattern image under test to a corrected pattern image as generated at the image corrector device to thereby inspect the pattern image for defects. For instance, the inspection apparatus is equipped with an illumination unit which emits illumination light onto a workpiece under testing, an image acquisition unit for detecting reflected light or transmission light from the under-test workpiece to thereby acquire a pattern image thereof, a reference data generator circuit for generating from CAD data design data resembling the graphics data of a reticle, and a comparison processing unit for comparing between the pattern images.

Figure 2:
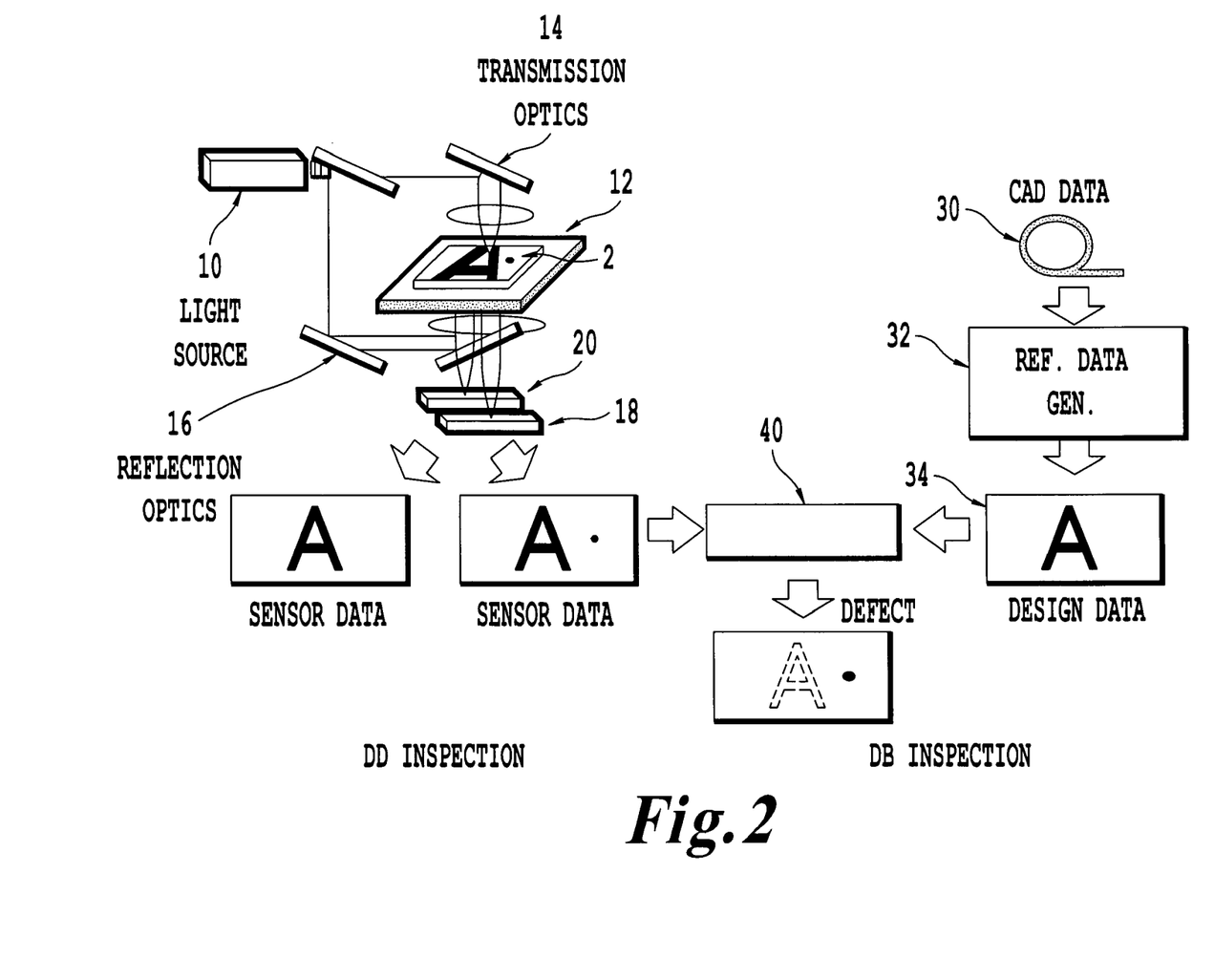
FIG. 2 depicts an exemplary configuration of a pattern inspection apparatus also embodying the invention.

See FIG. 2, which shows an exemplary arrangement of the pattern inspection apparatus. The illumination unit of this inspection apparatus includes a light source 10 for producing and emitting coherent light. The image acquisition unit includes a stage structure 12 which stably supports a reticle 2 as mounted thereon, a stage driver (not shown) for driving the stage 2, a transmission light optical system 14 which guides the light from the light source 12 to pass through the reticle 2 mounted on stage 12, a reflected light optics 16 capable of detecting its reflection light, an optical sensor module 18 for detecting light components that have passed through the optics 14, and a reflected light sensor 20 for sensing the reflected light from the reflection light optics 16. With such an arrangement, the pattern inspection apparatus is operable to acquire the sensor data (i.e., optical image) of the pattern image drawn on the reticle. The transmission optics 14 and reflection optics 16 are each made up of a half mirror and a convex lens assembly, for example. The pattern inspection apparatus includes at least one of the transmission optics 14 and reflection optics 16. The inspection apparatus includes at least one of the transmission light sensor 18 and the reflected light sensor 20. The inspection apparatus also includes a reference data generation circuit 32 which creates design data (i.e., reference image) based on CAD data 30 for the LSI design use. The apparatus further includes a comparison processing unit 40. With this arrangement, the inspection apparatus is capable of detecting pattern defects, if any, by either comparing sensor data sets together or comparing a sensor data set to the design data.

Figure 3:
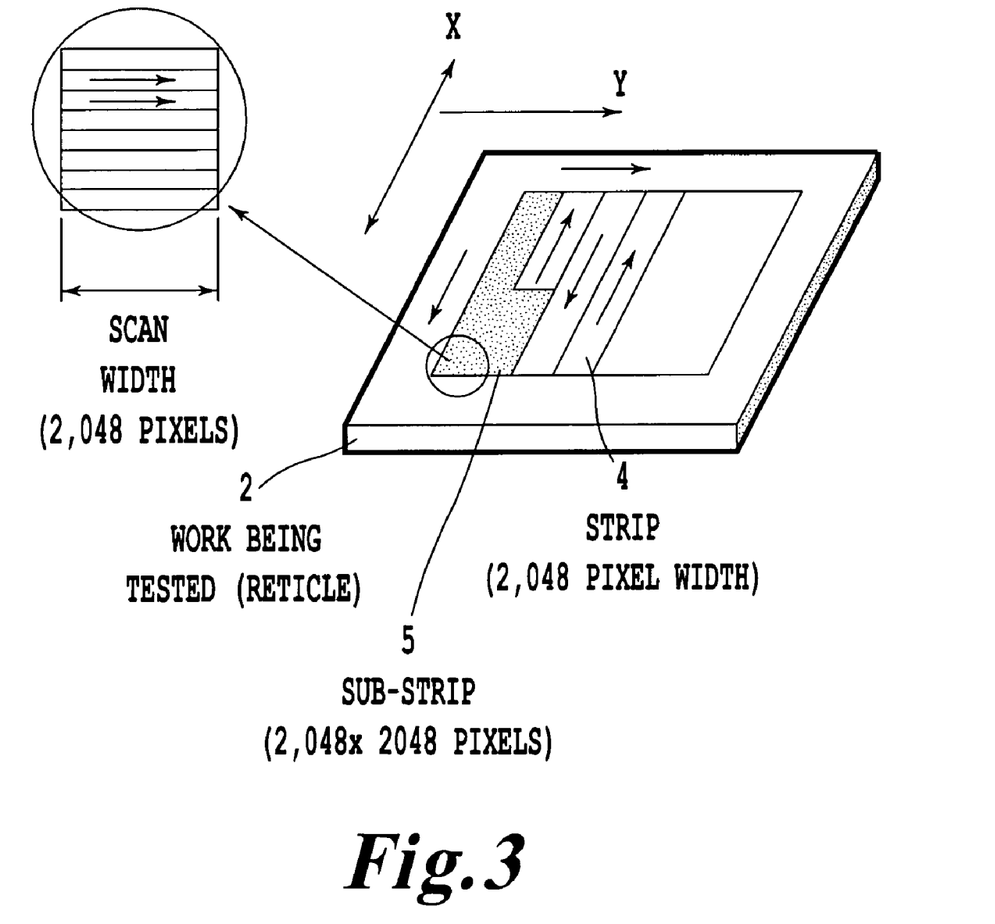
FIG. 3 is a perspective view of a reticle which is subject to image acquisition by the mask scanning of a line sensor.

A method of acquiring the pattern image drawn on the reticle 2 will be set forth with reference to FIG. 3. Firstly, let the reticle 2 be scanned by a line sensor having a linear array of photodiodes (PDs). Here, for purposes of convenience in description, a unitary narrow elongate portion 4 as cut out of the reticle surface area of interest in the X-axis direction (in a direction parallel to one side edge of reticle 2) will be called a one strip. This strip is further cut into fine square portions or "dies" in the Y-axis direction (in the direction perpendicular to the X-axis direction). A sensed image 5 of such die portion will be called one "sub-strip." The one sub-strip is arranged for example to have a matrix of 2,048 rows and 2,048 columns of picture elements or "pixels." The inspection that determines whether defects are present or absent is performed in units of substrips, by way of example. Additionally one pixel has 256 levels of grayscale.

The inspection apparatus performs a pattern inspection operation by comparing pattern images together as shown in FIG. 2. In the case of DD comparison, at least one of the transmission light or reflection light is used to store or "record" the resulting sensor data in either the sensor 18 or the sensor 20. Then, sensor data sets of two dies on the reticle 2 are compared together by the comparison processor unit 40 for detection of defects, if any. Alternatively in the case of the DB comparison, there are used the sensor data of one die on reticle 2 as recorded in the sensor 18 or 20 by using at least one of the transmission light and reflected light and the design data 34 created by the reference data generator circuit 32 based on the LSI design-use CAD data 30. Next in the DB comparison, the sensor data and design data 34 are compared together by the comparison processor 40 to thereby defect defects. Note here that the pattern inspection apparatus may be configured from electronic circuitry, software programs, personal computer (PC), or any possible combinations thereof.

(Comparison Processor Circuit)

Figure 4:
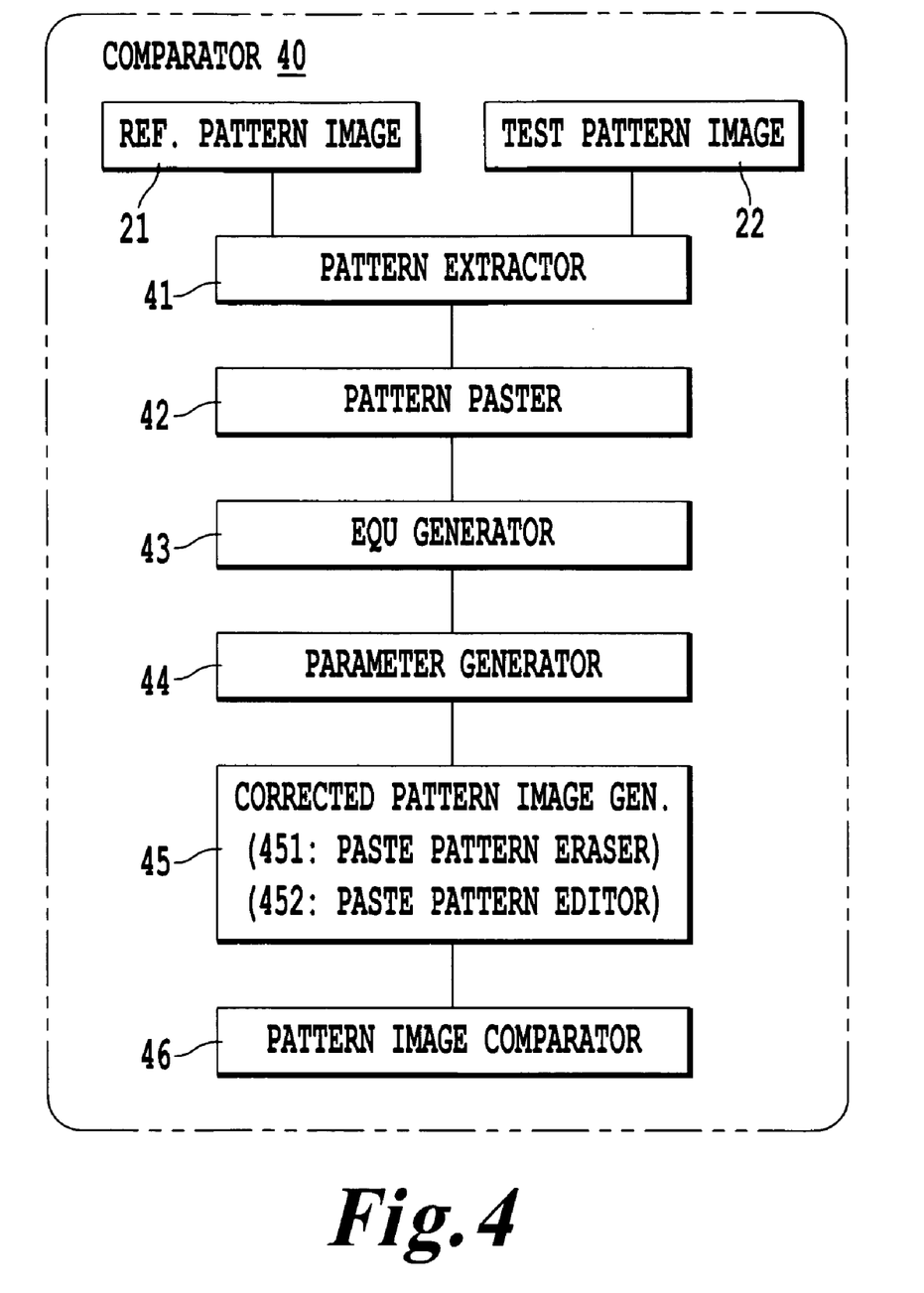
FIG. 4 shows an exemplary configuration of a comparison processor unit in the inspection apparatus of FIG. 2.

A configuration of the comparison processor unit 40 is shown in FIG. 4. The comparison processor 40 is the one that performs comparison processing of an inspection reference pattern image 21 and a pattern image 22 under test. Comparison processor 40 includes a pattern extraction unit 41, a pattern pasting unit 42, an equation generation unit 43 for generating a set of simultaneous equations, a parameter generation unit 44, a corrected pattern image generation unit 45, and a pattern image comparator unit 46. The pattern extractor 41 is operable to extract pattern elements from the reference pattern image 21 and under-test pattern image 22, respectively, thereby obtaining cut-and-paste patterns. The "extraction" may be interpreted as a process for obtaining such a paste pattern by copying the extracted pattern while letting it leave as it is—in other words, in a "nondestructive" manner—or by removing the extracted pattern while preventing it from continuing to stay thereafter—i.e., in a "destructive" way. The pattern paster 42 functions to paste or patch the extracted cut-and-paste pattern onto the reference pattern image 21, thereby producing an extracted pattern-pasted/patched inspection reference pattern image. Similarly, the pattern paster 42 pastes the paste pattern to the under-test pattern image 22 to thereby generate a pasted test pattern image.

The equation generator unit 43 is for generating a set of simultaneous equations by applying linear predictive modeling to the pasted reference pattern image and the pasted test pattern image. The parameter generator 44 operates to solve the simultaneous equations for obtaining one or more model parameters. The corrected pattern image generator 45 uses the model parameters to correct or "amend" the pattern image. The image generator 45 is capable of generating a corrected pattern image from any one of the reference pattern image and the test pattern image. Alternatively, this generator 45 may generate a paste-corrected pattern image from the pasted reference pattern image or the pasted test pattern image. To this end, image generator 45 includes a cut-and-paste pattern deleting or "erasing" unit 451 and a paste pattern modifying or "editing" unit 452. The paste pattern eraser 451 is for removing the cut-and-paste pattern from the pasted corrected pattern image to thereby generate a corrected pattern image. The paste pattern editor 452 is operatively responsive to receipt of an enlarged version of paste pattern as magnified from the pasted corrected pattern image, for shrinking the enlarged image to its original size and then bringing it back to the original position, thereby to generate a corrected pattern image. The pattern image comparator 46 compares the test pattern image to the corrected pattern image for execution of the pattern inspection required.

(Pattern Inspection Method)

Figure 5:
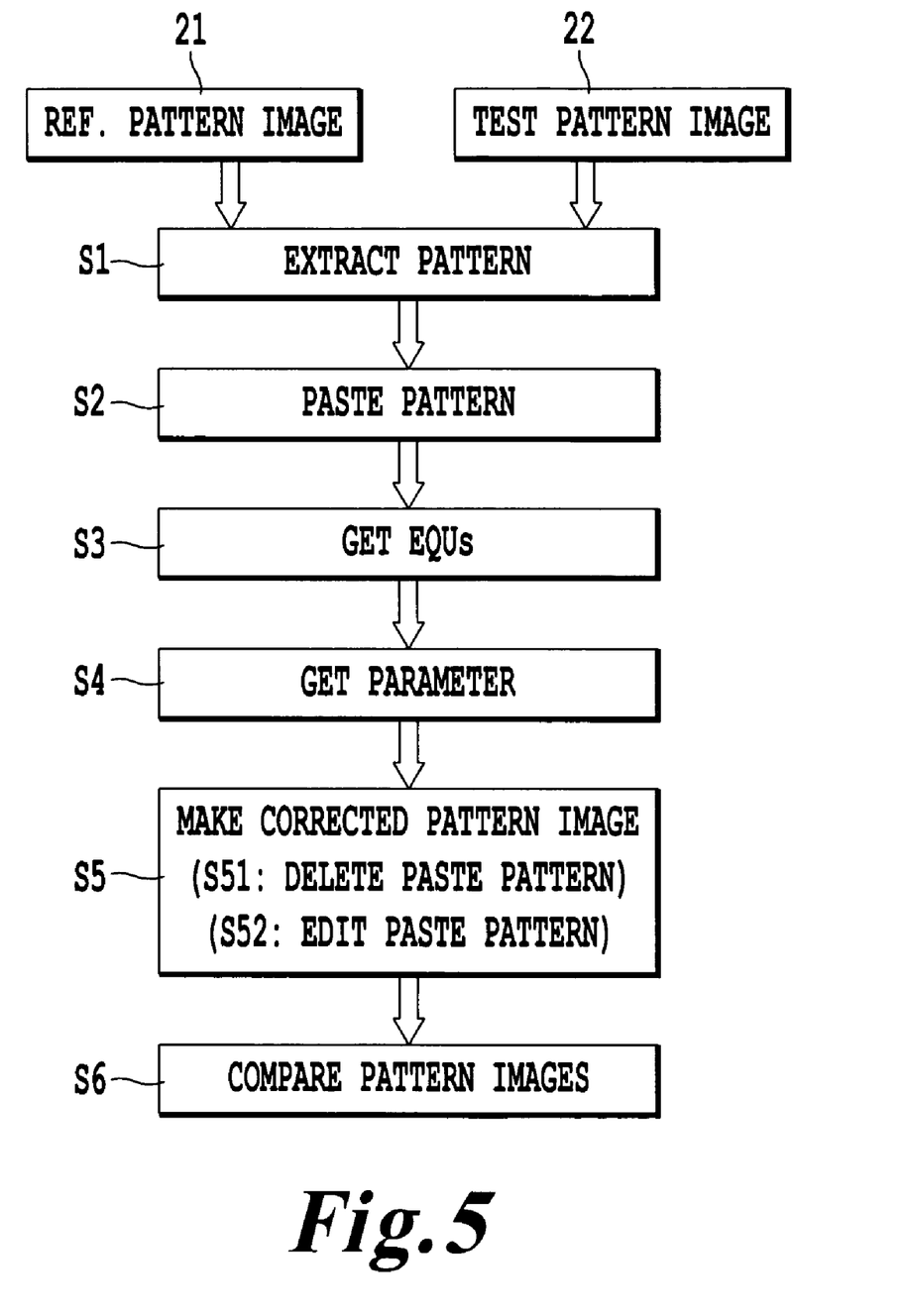
FIG. 5 is a flow diagram of a system procedure for pattern inspection.

Turning to FIG. 5, a pattern inspection method also embodying the invention is shown in flowchart form. This inspection method is the one that inspects a pattern image for defects by use of the corrected version of pattern image as obtained by the image correction method stated above. In cases where the inspection reference pattern image 21 and under-test pattern image 22 have therein a blank region with the absence of any pattern components, the inspection will be done in a procedure which follows. Note here that the blank region denotes an area or zone in which pattern elements are absent. The procedure starts with a pattern extraction step S1, which extracts cut-and-paste patterns from the inspection reference pattern image 21 and the under-test pattern image 22, respectively. Then, the procedure goes to a pattern paste step S2, which pastes or "patches" respective cut-and-paste patterns into blank regions of the reference pattern image 21 and test pattern image 22, thereby creating a pasted reference pattern image and a pasted test pattern image. At this step, the paste patterns are pasted to fill the blank regions at maximal densities. Then, proceed to an equation generation step S3, which generates a set of simultaneous equations by applying linear predictive modeling to the pasted reference pattern image and the pasted test pattern image. Next, go to a parameter generation step S4 which solves the set of simultaneous equations to obtain model parameters. At step S5, use the model parameters to correct the pattern image(s). More specifically, in the corrected pattern image generation step S5, generate corrected pattern images from the reference pattern image and under-test pattern image; alternatively, create a pasted corrected pattern image(s) from the pasted reference pattern image and pasted test pattern image. To this end, the corrected pattern image generation step S5 includes a pasted pattern deleting or "erasing" step S51 and a pasted pattern modifying or "editing" step S52. At the erasure step S51, remove the paste pattern from the pasted corrected pattern image to thereby generate a corrected pattern image. At the editing step S52, upon receipt of an expanded version of paste pattern as magnified from the pasted corrected pattern image, let this pattern shrink to its original size and then relocate it at the original position, thereby generating a corrected pattern image. Then, go to step S6 which compares the test pattern image 22 to the corrected pattern image, thereby performing pattern inspection. With the procedure stated above, even when the pattern image of the workpiece being tested is extremely low in density, it is possible to effectively perform the image correction in a similar way to that in the case of high-density pattern images. This pattern inspection method is realizable based on a software program to be installed in computers for execution thereby. This program has the process steps of the pattern inspection method stated supra. Additionally, using this pattern inspection method permits successful inspection of the pattern of a workpiece being tested, thereby enabling obtainment of a properly inspected workpiece.

(Equation Generation Unit and Step)

Figure 1A:
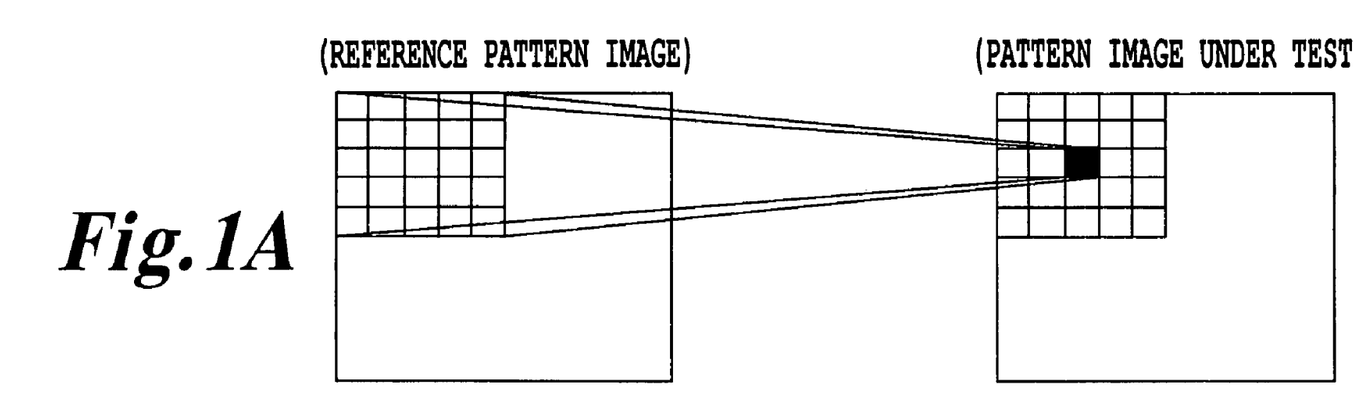
FIGS. 1A and 1B are diagrams showing a pattern image being tested and an inspection reference pattern image for explanation of a two-dimensional (2D) predictive modeling scheme for use in a pattern image inspection method embodying the invention.
Figure 1B:
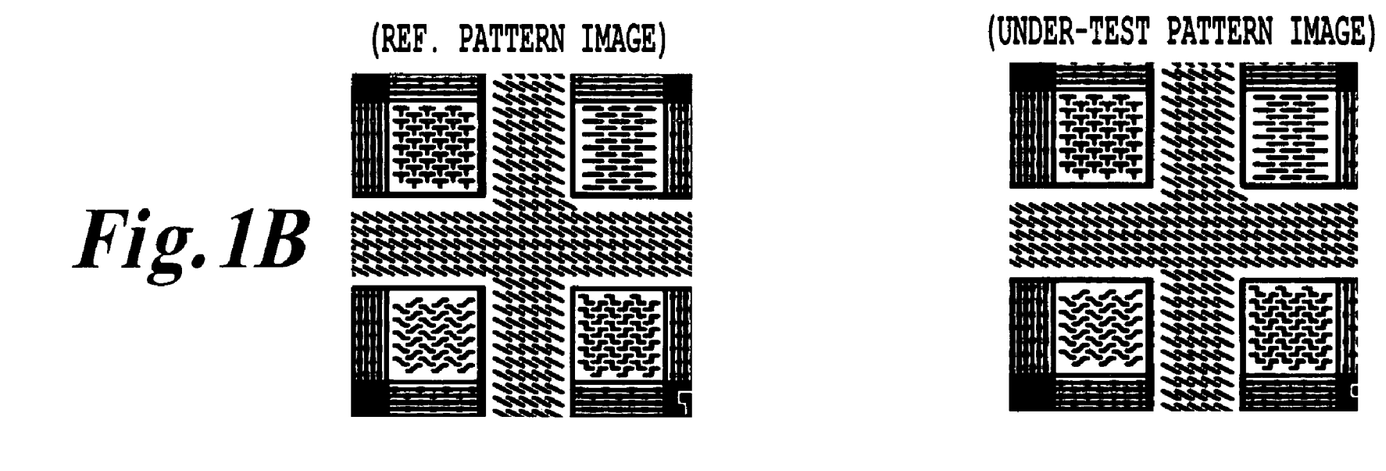

Referring to FIGS. 1A-1B, examples of the inspection reference pattern image and under-test pattern image are shown for explanation of the linear predictive modeling by use of the relationship therebetween. The above-noted image correction device uses a linear predictive modeling technique to correct the pattern image of interest at the comparison processor unit 40. The image correction device is the one that breaks through the limit of direct comparison methods. More specifically, as shown in FIG. 1B, the relation between the reference pattern image and test pattern image is online identified during inspection by use of linear predictive modeling—e.g., two-dimensional (2D) linear predictive modeling—to thereby establish a prediction model, which absorbs (fitting) any possible pixel position variations, expansion/shrink noises and sensing noises of the images concerned. Based on this predictive model, the corrected pattern image is created. This corrected pattern image is then compared to the test pattern image. Using a comparison result, defects of the test pattern image are detectable.

An explanation will first be given of a method for setting the 2D linear prediction model (2D input/output linear predictive model) while assuming that the inspection reference pattern image is 2D input data whereas the under-test pattern image is 2D output data. Suppose here that the 2D linear predictive model uses an area having a matrix of five rows and five columns (5×5) of pixels, for example. Suffixes used in this model, which correspond to the positions of 5×5 pixels, are indicated in Table 1 below. Note that in FIGS. 1A-1B, the reference pattern image is shown at the left-side part while the under-test pattern image is at the right-side part. Additionally the 2D linear predictive model is a linear predictive model in case the input and output data items are handled two-dimensionally.

TABLE 1

|   | 0 | 1 | 2 | 3 | 4 |
|---|---|---|---|---|---|
| 0 | i − 2, j − 2 | i − 2, j − 1 | i − 2, j | i − 2, j + 1 | i − 2, j + 2 |
| 1 | i − 1, j − 2 | i − 1, j − 1 | i − 1, j | i − 1, j + 1 | i − 1, j + 2 |
| 2 | i, j − 2 | i, j − 1 | i, j | i, j + 1 | i, j + 2 |
| 3 | i + 1, j − 2 | i + 1, j − 1 | i + 1, j | i + 1, j + 1 | i + 1, j + 2 |
| 4 | i + 2, j − 2 | i + 2, j − 1 | i + 2, j | i + 2, j + 1 | i + 2, j + 2 |

Let the 2D input and 2D output data be $u(i,j)$, $y(i,j)$, respectively. While the suffixes of the pixel of interest are given as "i" and "j," determine a block of 5×5 pixels (i.e., a total of twenty five pixels) around this pixel which is centrally located in the block. Then, let the suffixes of these nearby pixels be set as shown in Table 1. Next, regarding pixel data of a certain set of 5×5 pixel area, set up a relational equation (1) presented below. Note that in this equation (1), coefficients $b_{00}$ to $b_{44}$ of each input data $u(i,j)$ are the model parameters to be identified.

$$y_k = y(i, j) = \quad (1)$$
$$b_{00}u(i-2, j-2) + b_{01}u(i-2, j-1) + b_{02}u(i-2, j) +$$
$$b_{03}u(i-2, j+1) + b_{04}u(i-2, j+2) + b_{10}u(i-1, j-2) +$$
$$b_{11}u(i-1, j-1) + b_{12}u(i-1, j) + b_{13}u(i-1, j+1) +$$
$$b_{14}u(i-1, j+2) + b_{20}u(i, j-2) + b_{21}u(i, j-1) +$$
$$b_{22}u(i, j) + b_{23}u(i, j+1) + b_{24}u(i, j+2) +$$
$$b_{30}u(i+1, j-2) + b_{31}u(i+1, j-1) + b_{32}u(i+1, j) +$$
$$b_{33}u(i+1, j+1) + b_{34}u(i+1, j+2) + b_{40}u(i+2, j-2) +$$
$$b_{41}u(i+2, j-1) + b_{42}u(i+2, j) + b_{43}u(i+2, j+1) +$$
$$b_{44}u(i+2, j+2) + \varepsilon(i, j)$$

The meaning of Equation (1) is that the under-test pattern image's one pixel data $y_k = y(i,j)$ is representable by the linear coupling of data items of 5×5 pixels around its corresponding pixel in the inspection reference pattern image (see FIG. 1A). Note here that the residual difference $\varepsilon$ in Equation (1) is not evident in its statistical nature, and a parameter identification result obtained by a minimum squaring method to be later described will possibly have a bias. However, this rarely causes any serious deterrent in practical implementation. This can be said because the heart of this embodiment lies in the input/output data fitting using Equation (1) per se, and thus the parameter value of the residual difference $\varepsilon$ is out of direct use.

(Solving Simultaneous Equations)

The simultaneous equations are solved by the parameter generator unit 44 shown in FIG. 4 at step S4 of FIG. 5. A method of solving the equations is as follows. When vectorially representing Equation (1), Equation (2) is obtained. Here, an unknown parameter vector $\alpha$ is given as $\alpha = [b_{00}, b_{01}, \ldots b_{44}]^T$, and data vector $x_k$ is represented by $x_k = [u(i-2,j-2), u(i-2,j-1), \ldots, u(i+2,j+2)]^T$.

$$x_k^T \alpha = y_k \quad (2)$$

The model parameter identification is achievable in a way which follows: scan the coordinates i, j of the inspection reference pattern image and under-test pattern image to acquire data of pixels at the coordinates (i,j); then, combine together 25 sets of data into an equation system. Practically, from a statistical viewpoint, prepare n (n>25) sets of data as in Equation (3). Then, solve twenty five-dimensional set of equations-based on the minimum squaring method as will be set forth later, thereby identifying the value of α. Here, A=[x$_1$, x$_2$, ..., x$_n$]$^T$, y=[y$_1$, y$_2$, ..., y$_n$]$^T$, and x$_k^T$α=y$_k$, where k=1, 2, ..., n (n is an integer). These equations are solvable by the minimum squaring method or any other available methods, such as a maximum likelihood estimation method.

$$\begin{bmatrix} x_1^T \\ \vdots \\ x_n^T \end{bmatrix} \alpha = \begin{bmatrix} y_1 \\ \vdots \\ y_n \end{bmatrix} \Rightarrow A\alpha = y \Rightarrow \alpha = (A^T A)^{-1} A^T y \quad (3)$$

Assume that the inspection reference pattern image and the under-test pattern image are each a block of 512×512 pixels as an example. In this case, scanning the model of a 5×5 pixel region results in a decrease of two pixels at every side edge of the image of interest. Thus, the resultant equation number is given by Equation (4), which suggests that 258,064 sets of data are obtainable. This number is deemed sufficient in a statistical viewpoint.

$$n=(512-4)\times(512-4)=258064 \quad (4)$$

(Corrected Pattern Image Generation Unit and Step)

The parameter ac thus identified and the input/output image data used for the identification are then substituted into Equation (1). Then, perform simulation processing for scanning the pixel coordinates i, j to thereby generate a corrected pattern image. This image is such that the minimum square method-based fitting results in decreases in pixel position deviation of less than one pixel, expansion/shrink, swell noises, resizing processing and sensing noises. Although the data used for such simulation can contain therein defective pixels in most cases, these hardly appear in the corrected pattern image. This can be said because such defective pixels are extremely less in number than the entire data used for the identification so that these are no longer subject to the fitting in the minimum squaring method. Additionally the signal-to-noise (S/N) ratio is improved in the surrounding area, so defective pixels are emphasized. This is an additional advantage unique to the embodiment.

(Example of Paste Pattern Deletion by Copy/Paste Method)

Figure 7:
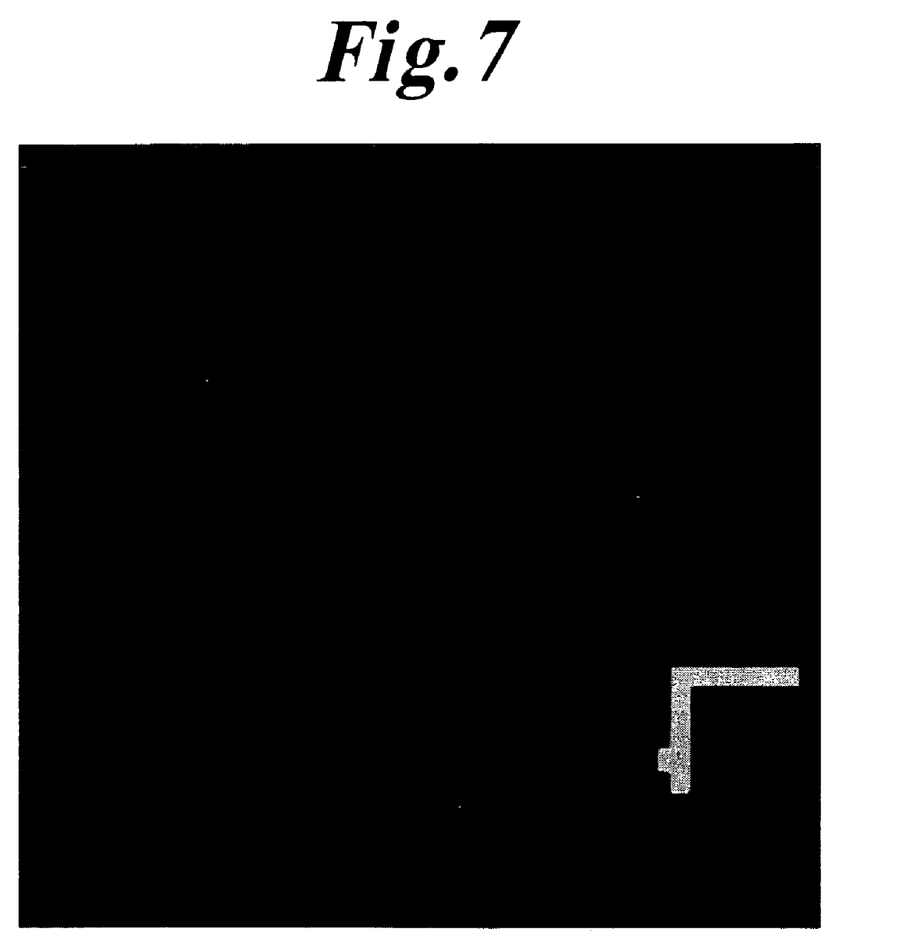
FIG. 7 is a pictorial representation of an exemplary low-density pattern image.

Referring to FIG. 7, a low-density pattern image is shown, which has a pattern element in a blank or "vacant" background area with no patterns exiting therein. Even when an attempt is made to apply for identification the 2D predictive modeling to such low-density pattern image, any intended model parameter accuracy is often unattainable due to the deficiency of an information amount within the matrix. Here, an explanation will be given of an exemplary method of compensating for such information amount deficiency in the matrix by use of a technique for virtually increasing the image density of the pattern.

Figure 6:
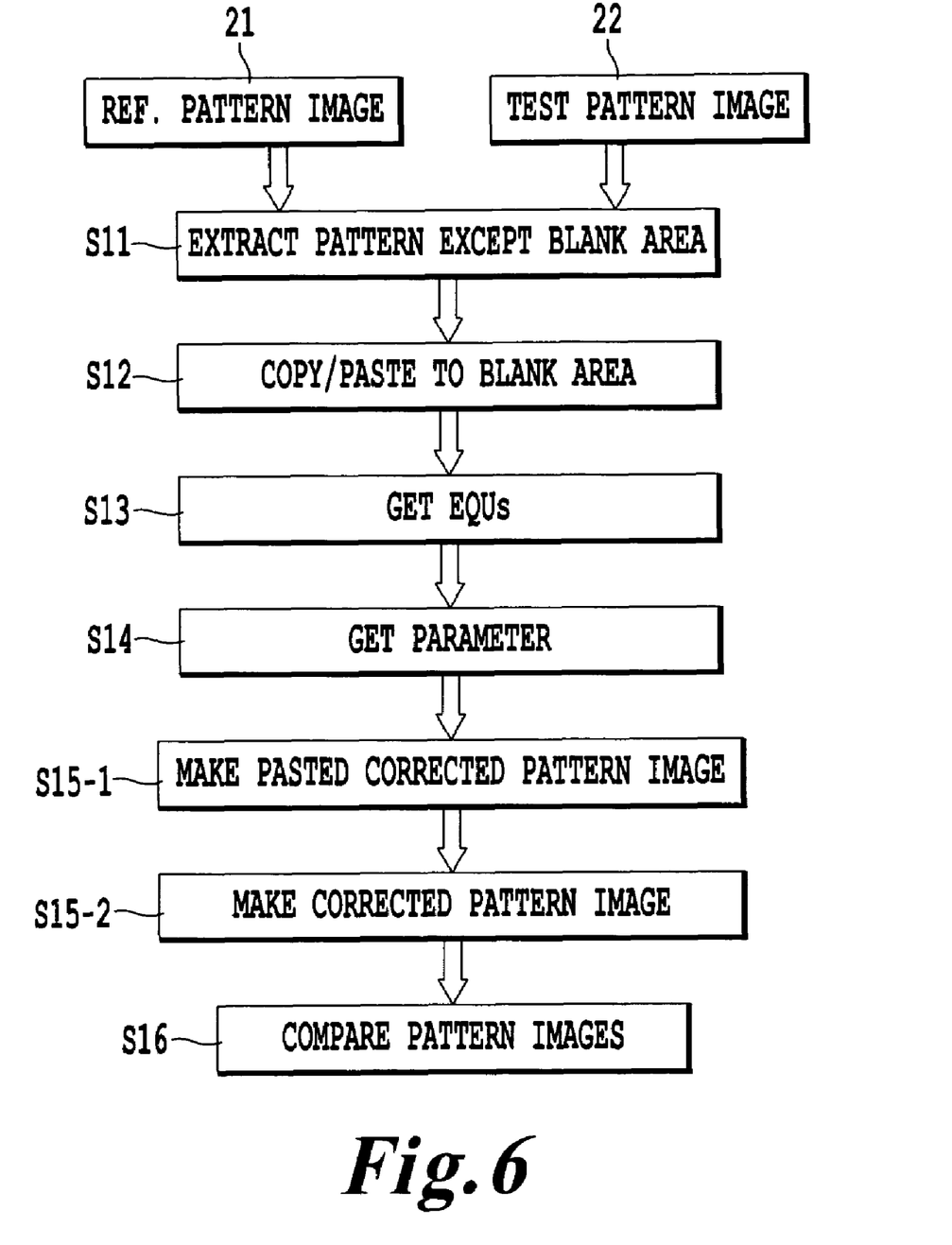
FIG. 6 is a flow chart showing a procedure of a copy-and-paste process.
Figure 8:
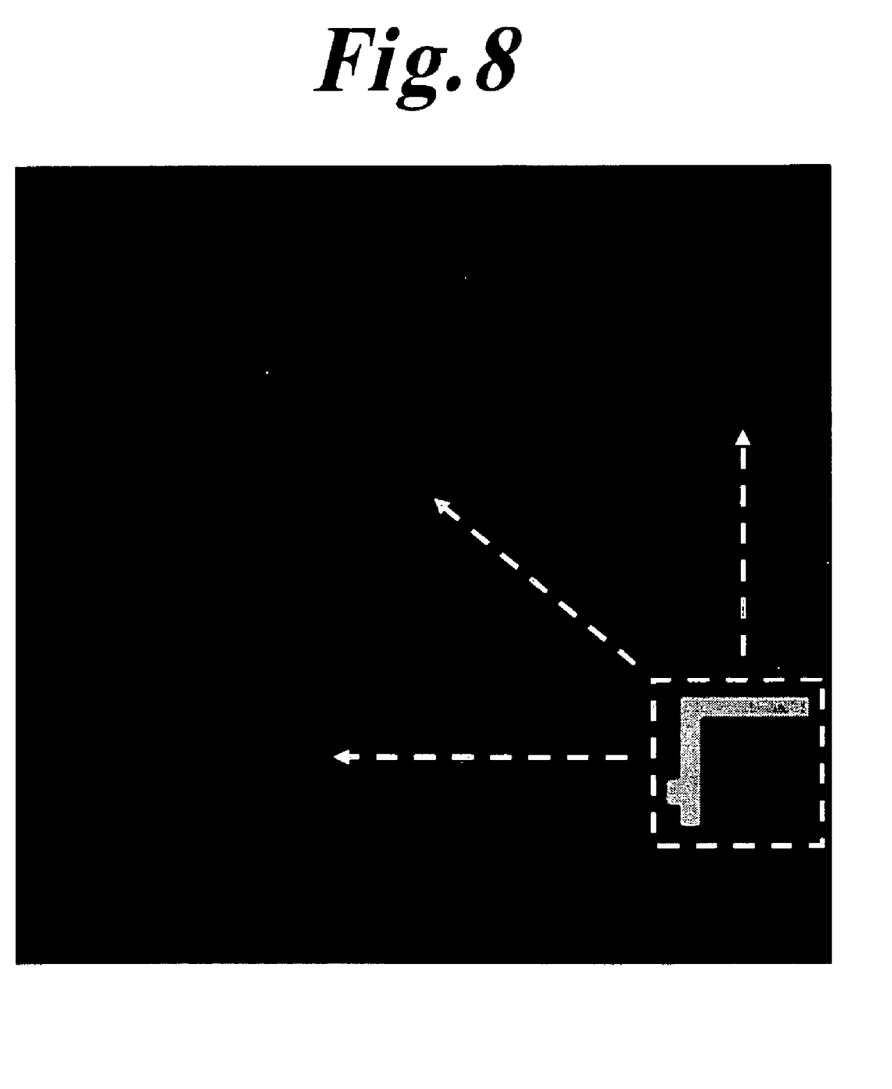
FIG. 8 shows the low-density pattern image of FIG. 7 which is subject to the copy/paste process.
Figure 9:
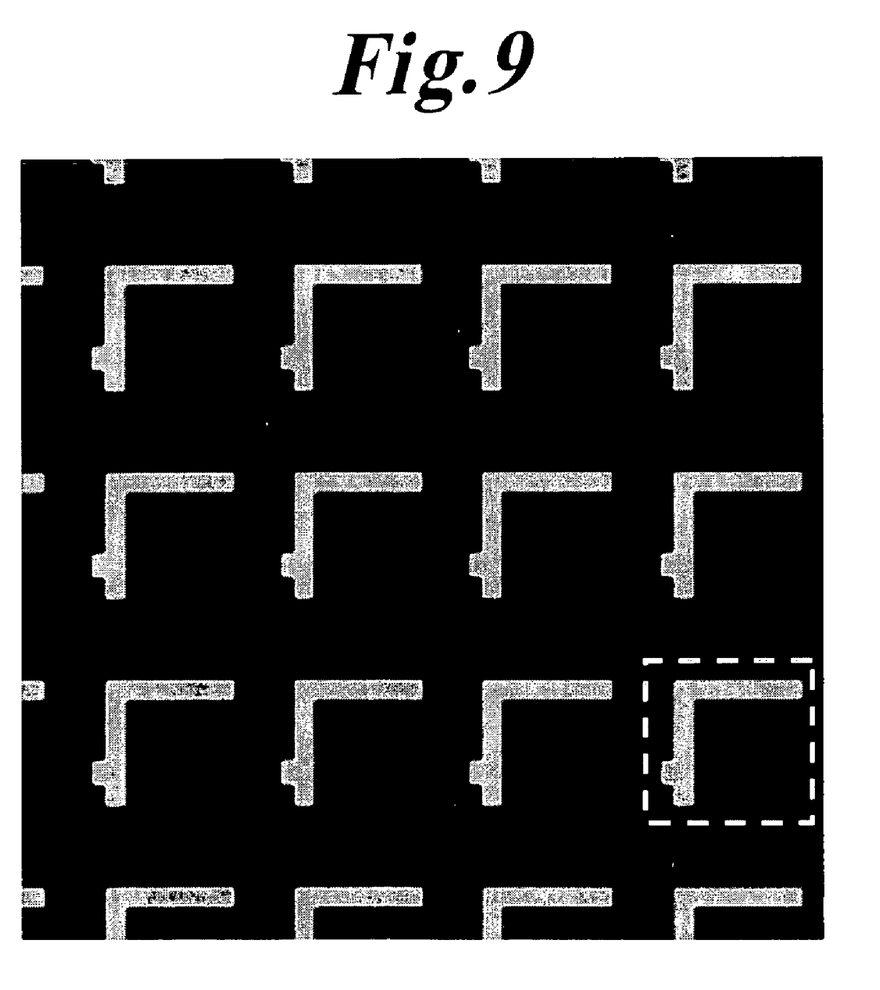
FIG. 9 shows an exemplary processed image resulting from the copy/paste process of the low-density pattern image.

A procedure for generating a corrected pattern image using a copy-and-paste method, which is also an embodiment of the invention, will be explained with reference to FIG. 6. First, at step S11, extract a pattern element from the blank area, such as a dark part, thereby creating a cut-and-paste pattern in a way as shown in FIG. 8. Then at step S12, paste or "patch" this extracted pattern to a chosen position in the blank area. This process of extracting a paste pattern and then pasting it into the blank area will be performed repeatedly, resulting in obtainment of a copy/paste result shown in FIG. 9. With this extraction and pasting processes, a new pasted inspection reference pattern image and pasted under-test pattern image are created. Next, at step S13, apply 2D linear predictive modeling to these pattern images. At step S13, perform parameter identification, followed by creation of a pasted corrected pattern image at step S15-1. Lastly at step S15-2, delete those portions other than the original pattern element (FIG. 7) from the patterns within this pasted corrected pattern image, for reproduction of the blank area to thereby generate a corrected pattern image. This corrected pattern image is then compared to the under-test pattern image, thus performing the pattern inspection at step S16.

(Example of Paste Pattern Retrieval by Centering Method)

Figure 10:
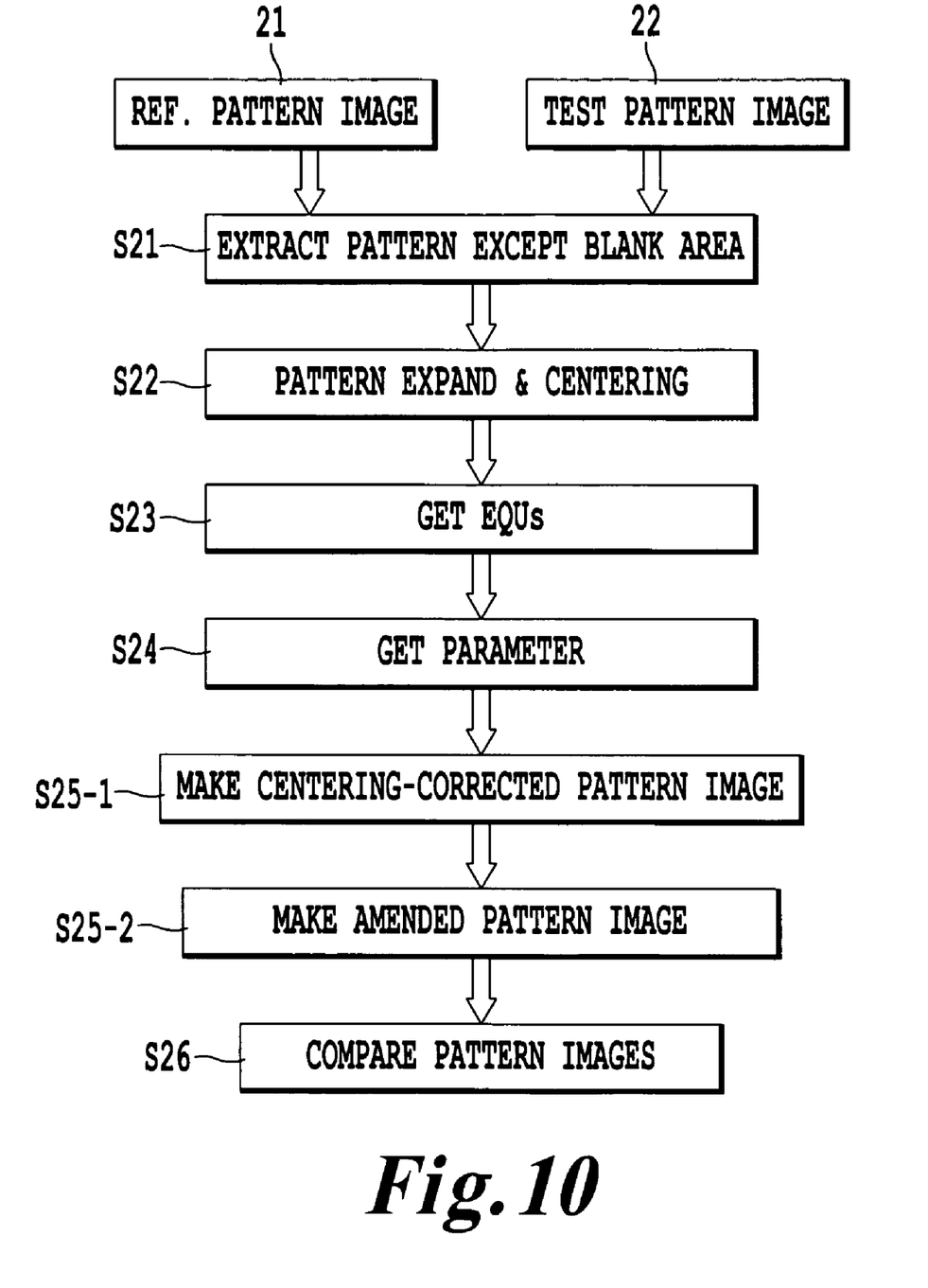
FIG. 10 is a flowchart of a procedure of a centering process.
Figure 11:
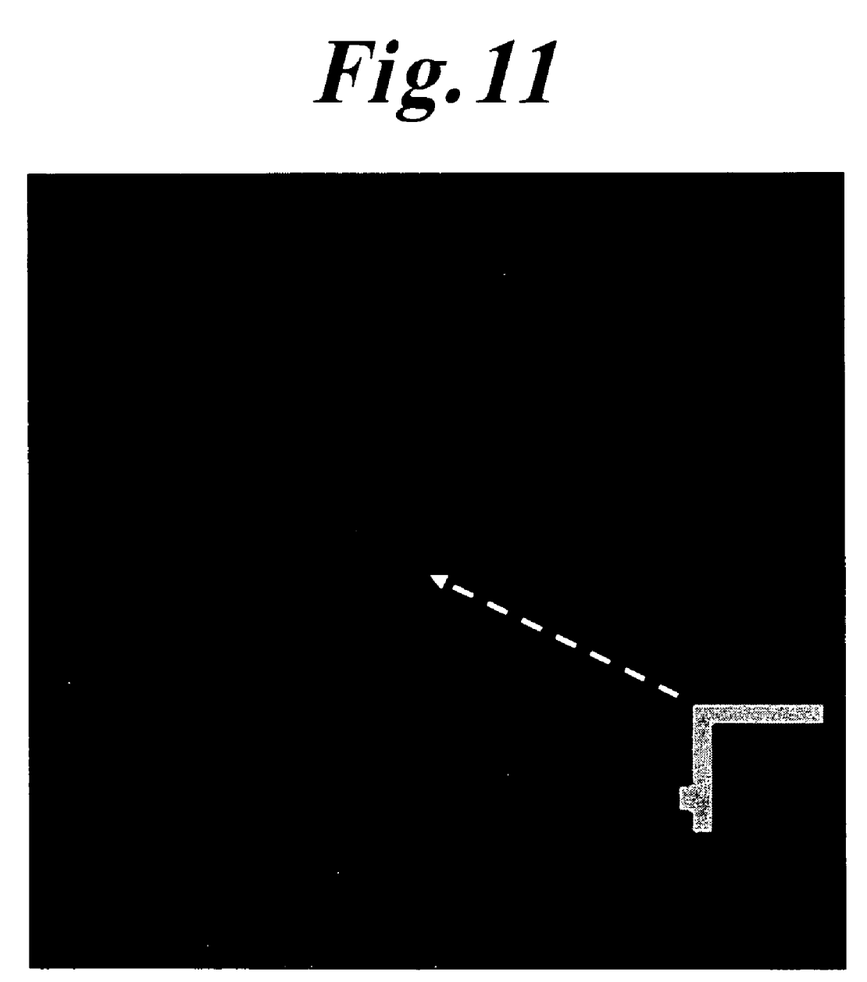
FIG. 11 shows a low-density pattern image which is applied the centering process.
Figure 12:
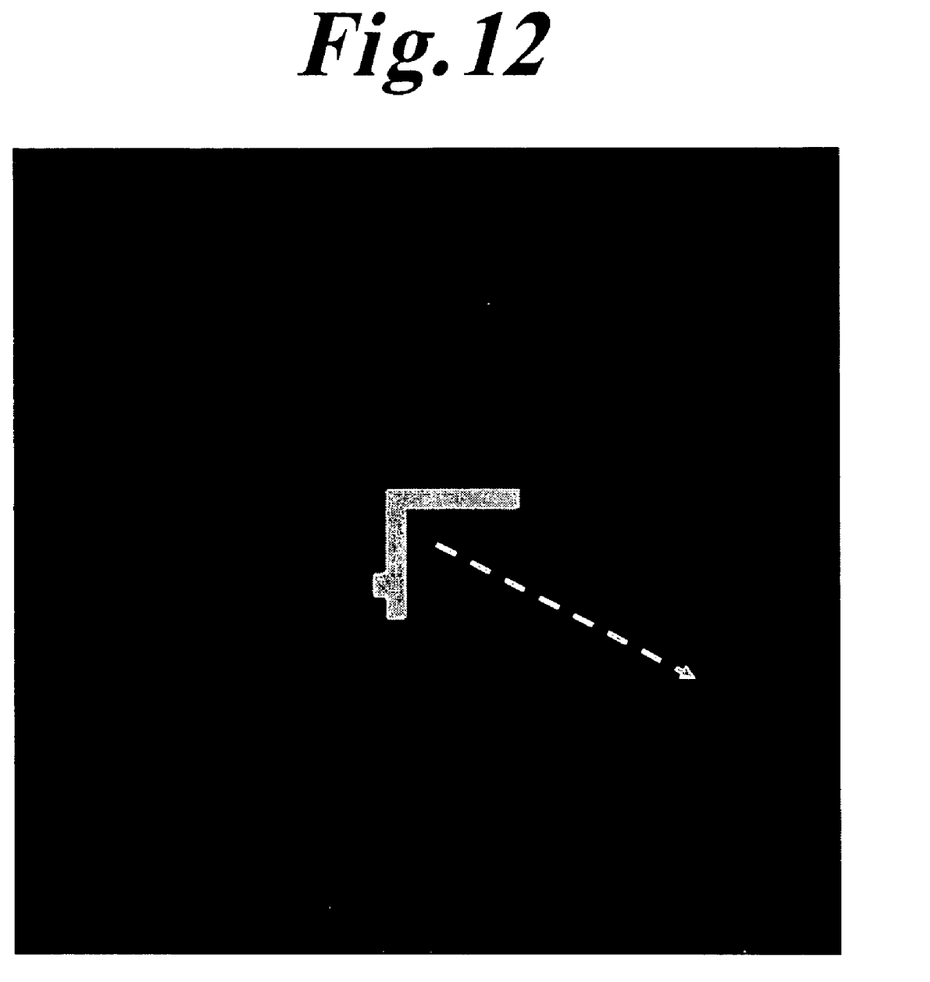
FIG. 12 shows a low-density pattern image with a centering-processed pattern component being in the process of returning to its original position.
Figure 13:
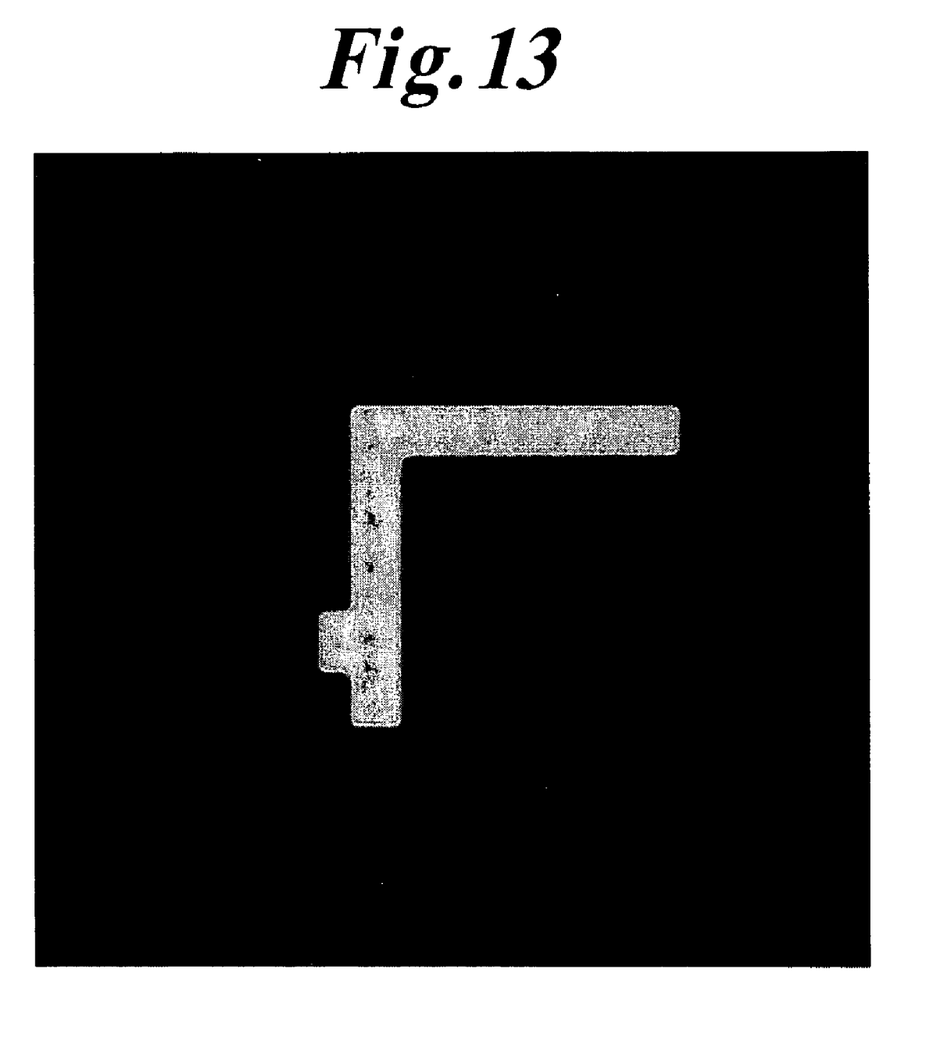
FIG. 13 shows a scaled-up or "zoomed" version of the pattern component shown in FIG. 11 for being subject to the centering process.

A procedure for creating a corrected pattern image using a centering method in accordance with another embodiment of the invention will be described with reference to FIG. 10. First, at step S21, extract a pattern element other than a dark part in its background area as shown in FIG. 11. Then, at step S22, enlarge or expand the extracted pattern to have its size more than one time greater than the original, followed by execution of the centering treatment to create a new pasted inspection reference pattern image. Next, at step S23, apply 2D predictive modeling to this newly created reference pattern image and the pasted under-test pattern image. In step S24, perform parameter identification. Then, at step S25-1, generate a pasted corrected pattern image with the centering applied thereto. Lastly, at step S25-2, shrink or downsize the pattern within the centering-applied pasted corrected pattern image such as shown in FIG. 12 to have a size being more than one time smaller than the previous size, and then relocate it to its original position. Thus, a corrected pattern image is generated. For reduction to practice, the centering is executed while magnifying by severalfold as shown in FIG. 13. This corrected pattern image is compared to the under-test pattern image, thereby to perform pattern inspection at step S26 of FIG. 10.

As apparent from the foregoing description, in accordance with this invention, it is possible to provide an effective image correction method for use in a pattern inspection apparatus such as reticle inspection apparatus, which method offers enhanced correction capabilities of extra-low density pattern images in a similar way to high-density pattern images. Additionally the invention should not exclusively be limited to the illustrative embodiments as disclosed herein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image correction device for using an inspection reference pattern image of a workpiece being tested and a pattern image under test to generate a corrected pattern image, said device comprising:

a pattern extraction unit operative to cut a pattern as a cut-and-paste pattern out of a pattern existence region of each of the reference pattern image and the under-test pattern image;

a pattern pasting unit operative to paste the cut-and paste pattern in pattern-less blank regions of the reference pattern image and the under-test pattern image to thereby generate a pasted reference pattern image and a pasted test pattern image;

an equation generation unit operative to generate by linear predictive modeling a set of simultaneous equations for the pasted reference pattern image and the pasted test pattern image;

a parameter generation unit operative to solve the simultaneous equations and obtain more than one model parameter; and a corrected pattern image creation unit operative to use the model parameter to apply the linear predictive modeling to the pattern image for creation of a corrected pattern image.

2. The device according to claim 1, wherein said corrected pattern image creation unit creates a corrected pattern image by applying the modeling to the reference pattern image.

3. The device according to claim 1, wherein said pattern pasting unit patches the cut-and-paste pattern in such a way as to fill the blank region.

4. The device according to claim 3, wherein said corrected pattern image creation unit applies the modeling to the pasted test pattern image for creating a pasted corrected pattern, and wherein said device further comprises:
a deletion unit for removing the cut-and-paste pattern from the pasted corrected pattern image to thereby generate a corrected pattern image.

5. The device according to claim 1, wherein said pattern pasting unit zooms the cut-and-paste pattern and then patches a zoomed pattern image to the blank region.

6. The device according to claim 5, wherein said corrected pattern image creation unit applies the modeling to the pasted reference pattern image for creating a pasted corrected pattern image, said device further comprising:
a modifier unit for shrinking the cut-and-paste pattern as zoomed from the pasted corrected pattern image and for bringing a shrunk image back to its original position to thereby create a corrected pattern image.

7. The device according to claim 1, wherein the linear predictive modeling is a two-dimensional ("2D") predictive modeling scheme while letting each pixel of the under-test pattern image be a 2D output data and letting a linear coupling of pixels around a one pixel of the reference pattern image corresponding to said each pixel be a 2D input data.

8. The device according to claim 1, wherein the linear predictive modeling is a 2D linear predictive modeling scheme while letting each pixel of the under-test pattern image be a 2D output data and letting a linear coupling of a matrix of five rows and five columns of pixels including as a center pixel a one pixel of the reference pattern image corresponding to said each pixel be a 2D input data.

9. An apparatus for performing pattern inspection while using a reference pattern image of a workpiece being tested and a pattern image under test to generate a correction pattern image, said apparatus comprising:
a pattern extraction unit operative to cut a pattern as a cut-and-paste pattern out of a pattern existence region of the reference pattern image and the under-test pattern image;
a pattern pasting unit operative to paste the cut-and paste pattern in pattern-less blank regions of the reference pattern image and the under-test pattern image to thereby generate a pasted reference pattern image and a pasted test pattern image;
an equation generation unit operative to generate by linear predictive modeling a set of simultaneous equations for the pasted reference pattern image and the pasted test pattern image;
a parameter generation unit operative to solve the simultaneous equations and obtain more than one model parameter;
a corrected pattern image creation unit operative to use the model parameter to apply the linear predictive modeling to the pattern image for creation of a corrected pattern image; and
a pattern image comparison unit operative to compare the corrected pattern image and the under-test pattern image for detecting defects of the under-test pattern image.

10. An image correction method for using an inspection reference pattern image of a workpiece being tested and a pattern image under test to generate a corrected pattern image carried out by an image correction device, said method comprising:
cutting a pattern as a cut-and-paste pattern out of a pattern existence region of the reference pattern image and the under-test pattern image by the image correction device;
pasting the cut-and-paste pattern in pattern-less blank regions of the reference pattern image and the under-test pattern image to thereby generate a pasted reference pattern image and a pasted test pattern image by the image correction device;
generating by linear predictive modeling a set of simultaneous equations for the pasted reference pattern image and the pasted test pattern image by the image correction device;
solving the simultaneous equations and obtain more than one model parameter by the image correction device; and
using the model parameter to apply the linear predictive modeling to the pattern image for creation of a corrected pattern image by the image correcting device.

11. A method for performing pattern inspection while using a reference pattern image of a workpiece being tested and a pattern image under test to generate a correction pattern image carried out by a pattern inspection apparatus, comprising:
cutting a pattern as a cut-and-paste pattern out of a pattern existence region of the reference pattern image and the under-test pattern image by the pattern inspection apparatus;
pasting the cut-and-paste pattern in pattern-less blank regions of the reference pattern image and the under-test pattern image to thereby generate a pasted reference pattern image and a pasted test pattern image by the pattern inspection apparatus;
generating by linear predictive modeling a set of simultaneous equations for the pasted reference pattern image and the pasted test pattern image by the pattern inspection apparatus;
solving the simultaneous equations and obtain more than one model parameter by the pattern inspection apparatus;
using the model parameter to apply the linear predictive modeling to the pattern image for creation of a corrected pattern image by the pattern inspection apparatus; and
comparing the corrected pattern image and the under-test pattern image for detecting defects of the under-test pattern image by the pattern inspection apparatus.

* * * * *